(12) United States Patent
Seif et al.

(10) Patent No.: US 10,290,617 B2
(45) Date of Patent: May 14, 2019

(54) LED LIGHT SOURCE COMPRISING AN ELECTRONIC CIRCUIT

(71) Applicant: VALEO VISION, Bobigny (FR)

(72) Inventors: Lothar Seif, Bobigny (FR); Zdravko Zojceski, Bobigny (FR); Vanessa Sanchez, Bobigny (FR); Gilles Le Calvez, La Verriere (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/759,434

(22) PCT Filed: Sep. 13, 2016

(86) PCT No.: PCT/EP2016/071598
§ 371 (c)(1),
(2) Date: Mar. 12, 2018

(87) PCT Pub. No.: WO2017/046107
PCT Pub. Date: Mar. 23, 2017

(65) Prior Publication Data
US 2018/0254266 A1 Sep. 6, 2018

(30) Foreign Application Priority Data

Sep. 14, 2015 (FR) ..................................... 15 58543

(51) Int. Cl.
*H01L 25/16* (2006.01)
*H01L 27/15* (2006.01)
(Continued)

(52) U.S. Cl.
CPC ............ *H01L 25/167* (2013.01); *H01L 27/15* (2013.01); *H01L 33/24* (2013.01); *H01L 33/62* (2013.01); *F21S 41/141* (2018.01); *F21S 43/14* (2018.01); *F21S 45/10* (2018.01); *H01L 33/0079* (2013.01); *H01L 33/16* (2013.01); *H05B 33/32* (2013.01); *H05B 33/089* (2013.01)

(58) Field of Classification Search
CPC ......... H01L 33/24; H01L 33/32; H01L 33/62; H01L 33/0079; H01L 25/167; H01L 27/15; H01L 27/10; F21S 41/141; F21S 45/10; F21S 43/14; H05B 33/089
See application file for complete search history.

(56) References Cited

U.S. PATENT DOCUMENTS

2005/0006754 A1* 1/2005 Arik ....................... B82Y 10/00
257/712
2011/0254034 A1 10/2011 Konsek et al.
(Continued)

FOREIGN PATENT DOCUMENTS

DE 10 2011 056 888 A1 6/2013
DE 10 2012 109 460 A1 4/2014

OTHER PUBLICATIONS

International Search Report dated Jan. 10, 2017 in PCT/EP2016/071598 filed Sep. 13, 2016.

*Primary Examiner* — Yosef Gebreyesus
(74) *Attorney, Agent, or Firm* — Oblon, McClelland, Maier & Neustadt, L.L.P.

(57) ABSTRACT

An electroluminescent light source including light-emitting diodes arranged on a substrate made of silicon. The light source integrates an electronic circuit performing a function that is necessary for controlling the light-emitting diodes.

13 Claims, 1 Drawing Sheet

(51) Int. Cl.
  *H01L 33/24*   (2010.01)
  *H01L 33/62*   (2010.01)
  *H01L 33/16*   (2010.01)
  *F21S 43/14*   (2018.01)
  *F21S 45/10*   (2018.01)
  *F21S 41/141*  (2018.01)
  *H01L 33/00*   (2010.01)
  *H01L 33/32*   (2010.01)
  *H05B 33/08*   (2006.01)

(56) References Cited

U.S. PATENT DOCUMENTS

| | | | |
|---|---|---|---|
| 2012/0018745 A1* | 1/2012 | Liu | H01L 25/167 |
| | | | 257/88 |
| 2012/0029864 A1* | 2/2012 | Belak | G01J 1/0425 |
| | | | 702/134 |
| 2012/0032182 A1 | 2/2012 | Sills et al. | |
| 2014/0048828 A1 | 2/2014 | Yang et al. | |
| 2014/0239327 A1 | 8/2014 | Konsek et al. | |
| 2014/0264410 A1* | 9/2014 | Lin | H01L 25/167 |
| | | | 257/98 |
| 2014/0301054 A1* | 10/2014 | Nagai | H01L 33/62 |
| | | | 361/761 |
| 2015/0014716 A1 | 1/2015 | Von Malm | |
| 2015/0279902 A1 | 10/2015 | Von Malm et al. | |
| 2016/0194458 A1* | 7/2016 | Ozturk | C07F 5/027 |
| | | | 528/8 |
| 2016/0247855 A1 | 8/2016 | Von Malm | |

* cited by examiner

LED LIGHT SOURCE COMPRISING AN ELECTRONIC CIRCUIT

The invention relates to the field of lighting and light signaling, in particular for motor vehicles.

In the field of lighting and light signaling for motor vehicles, it is becoming increasingly common to use light sources based on light-emitting semiconductor components, for example light-emitting diodes, LEDs. An LED component emits light rays when a voltage with a value that is at least equal to a threshold value, referred to as direct voltage, is applied to its terminals.

In a known manner, one or more LEDs of a lighting module for a motor vehicle are supplied with power via power supply control means, which comprise converter circuits. The power supply control means are configured to convert an electric current of a first magnitude, for example delivered by a current source of the motor vehicle, such as a battery, to a load current having a second magnitude that is different from the first. The control means are typically formed by surface-mounted components, SMD ("surface-mounted device") on a dedicated printed circuit board (PCB) that is remote with respect to the location of the PCB that comprises the LEDs. The control means are connected electrically to the LEDs by suitable wiring.

Known configurations therefore involve a plurality of printed circuit boards that give rise to a bulk and a weight that are difficult to manage when designing lighting modules for motor vehicles. Specifically, the space available for housing the various electronic components of such a module is limited, and reducing the weight is currently considered to be an overall objective in the field of automotive design.

One aim of the invention is to propose a solution that overcomes the abovementioned problem. More particularly, one aim of the invention is to propose an LED light source that integrates an electronic circuit implementing a function that is necessary for controlling the light source.

One subject of the invention is a semiconductor light source comprising a first substrate made of silicon and at least one light-emitting diode arranged on the substrate. The light source is noteworthy in that the source comprises an electronic circuit intended to perform a function that is necessary for controlling the diode(s).

The electronic circuit may preferably be implanted on the first substrate of the source.

The source may preferably comprise a second substrate made of silicon and attached to the first substrate, the electronic circuit being implanted on the second substrate. The source may comprise a plurality of second substrates made of silicon and attached to the first substrate.

The second substrate may preferably be attached to the first substrate on the face opposite the face on which the diode(s) are arranged.

The substrates may preferably be attached to one another by solder, in particular by gold-tin solder.

The two substrates may preferably comprise vias that are intended for the electrical interconnection of the two substrates.

The source may preferably comprise a plurality of light-emitting diodes.

The light-emitting diodes may preferably be in the form of light-emitting rods of submillimetric size projecting from the substrate.

The rods may preferably be arranged in a matrix. The matrix may preferably be regular, such that there is a constant spacing between two successive rods of a given alignment, or such that the rods are arranged in quincunx.

The height of a rod may preferably be between 1 and 10 micrometers.

The largest dimension of the end face may preferably be smaller than 2 micrometers.

The minimum distance separating two immediately adjacent rods may preferably be equal to 10 micrometers.

The area of the lighting surface of the light source may preferably be at most 8 $mm^2$.

The luminance achieved by the plurality of light-emitting rods may be for example at least 60 $Cd/mm^2$.

As an alternative, the light-emitting diodes may be in the form of a thin film.

The diodes may preferably be distributed into a plurality of groups, the diodes of each group being able to emit a specific light.

The groups may have shapes, dimensions and/or a number of diodes that are different from one another.

Each group is preferably able to be supplied with power independently of the other groups.

Each of the groups may preferably be able to emit light of a specific intensity and/or color.

The first substrate may preferably comprise bonding pads intended to connect it electrically to a current source by bridging.

The electronic circuit may preferably be able to perform at least one of the following functions:
- storing bin information relating to the light-emitting diodes;
- measuring the temperature of the light-emitting diodes;
- controlling the supply of electric power to the light-emitting diodes;
- the circuit making it possible to switch between at least two lighting functions;
- the circuit making it possible to choose a specific electrical connection of a plurality of groups of light-emitting diodes;
- protecting the groups of rods and/or limiting the current flowing through these groups.

The circuit may in particular preferably switch between a series connection and a parallel connection of a plurality of groups of diodes of the light source.

The electronic circuit may preferably be integrated directly into the substrate of the source, for example by etching.

Another subject of the invention is a lighting module comprising:
- at least one light source able to emit light rays;
- an optical device able to receive the light rays and to produce a light beam.

The module is noteworthy in that the light source(s) are in accordance with the invention.

The provisions of the invention are beneficial in that they make it possible to obtain an electronic component that groups together a first main function of a light source, that is to say the emission of light rays, with at least one second function intended for the electrical control of the light source. In comparison with known components, the volume saving is evident as the invention makes it possible to dispense with printed circuit boards that are dedicated to controlling a light source. Likewise, the invention brings about a weight reduction of the source/control means assembly.

Other features and advantages of the present invention will be better understood with the aid of the description and the drawings, in which.

Figure 1:
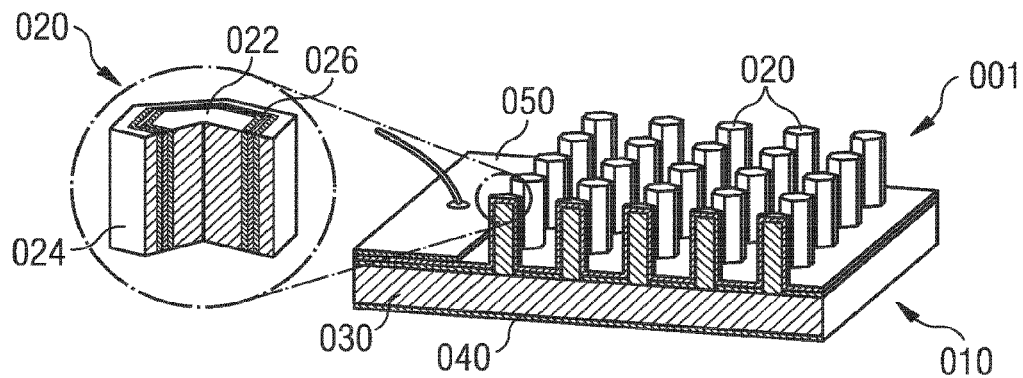
FIG. 1 is a depiction of a light source as implemented in one preferred embodiment of the present invention.

In the following description, similar reference numerals will generally be used to describe similar concepts across the various embodiments of the invention. Thus, the numerals 001, 101, 201 describe a light source according to different embodiments according to the invention.

Unless specified otherwise, technical features that are described in detail for one given embodiment may be combined with the technical features that are described in the context of other embodiments described by way of non-limiting example.

FIG. 1 illustrates an electroluminescent light source 001 according to a first embodiment of the invention. FIG. 1 illustrates the basic principle of the light source. The light source 001 comprises a substrate 010 made of silicon and on which are arranged a series of light-emitting diodes or rods in the form of wires 020 projecting from the substrate. The core 022 of each rod 020 is made of n-type semiconductor material, that is to say doped with electrons, while the envelope 024 is made of p-type semiconductor material, that is to say doped with holes. A recombination zone 026 is provided between the n-type and p-type semiconductor materials. It is however possible to contemplate reversing the semiconductor materials, in particular depending on the chosen technology.

The substrate is advantageously made of silicon, and the rods have a diameter of less than one micron. As a variant, the substrate comprises a layer of semiconductor material doped with holes, and the wires have a diameter of between 100 and 500 nm. The semiconductor material doped with electrons and with holes forming the diodes may advantageously be gallium nitride (GaN) or gallium-indium nitride (InGaN). The height of a rod is typically between 1 and 10 micrometers, whereas the largest dimension of the end face is smaller than 2 micrometers. According to one preferred embodiment, the rods are arranged in a matrix with a regular distribution. The distance between two rods is constant and equal to at least 10 micrometers. The rods may be arranged in quincunx. The area of the lighting surface of such a light source is at most 8 mm$^2$. The light source is capable of producing a luminance of at least 60 Cd/mm$^2$.

With reference to FIG. 1, the substrate 010 comprises a main layer 030, advantageously made of silicon, a first electrode or cathode 040 arranged on the face of the main layer that is opposite the rods 020, and a second electrode or anode 050 arranged on the face comprising the rods 020. The anode 050 is in contact with the p-type semiconductor material forming the envelopes 024 of the rods 020 and extending on the corresponding face of the substrate 010, so as to form a conductive layer between said envelopes 024 and the anode 050. The cores or centers 022 of the rods are, for their part, in contact with the main semiconductor layer 030 and thus in electrical contact with the cathode 040.

When an electric voltage is applied between the anode and the cathode, electrons of the n-type semiconductor material recombine with holes of the p-type semiconductor material and emit photons. The majority of the recombinations are radiative. The emitting face of the rods is the p zone, as this is the most radiative.

According to some embodiments of the invention, the light source 001 comprises a plurality of groups of light-emitting rods linked to different anodes. Each group is thus able to be supplied with electric power independently of the other(s). The rods of each group are advantageously all of the same type, that is to say emitting in the same spectrum and emitting at a common intensity. The groups are advantageously identical and exhibit a common direct voltage. Each group therefore preferably comprises substantially the same number of light-emitting rods. As an alternative, each group may exhibit a different geometry, and the groups may have different sizes. According to the principle of the invention, an electronic circuit intended to perform a function that is necessary for controlling the rods is integrated into such a light source.

An alternative technology for obtaining a light-emitting diode light source on a substrate made of silicon is described in patent document EP 2223348 A1. The active layer, for example made of gallium nitride, GaN, is deposited on a substrate made of sapphire, and the active layer is then transferred onto a substrate or wafer made of silicon, the assembly being carried out for example using a gold-tin solder. The resulting diodes are generally termed thin-film light-emitting diodes. According to the invention, a light source may comprise a plurality of groups of light-emitting diodes of this type, each group being able to be supplied with power independently of the other groups. The diodes of each group are advantageously all of the same type, that is to say emitting in the same spectrum and emitting at a common intensity. According to the principle of the invention, an electronic circuit intended to perform a function that is necessary for controlling the diodes is integrated into such a light source.

Figure 2:
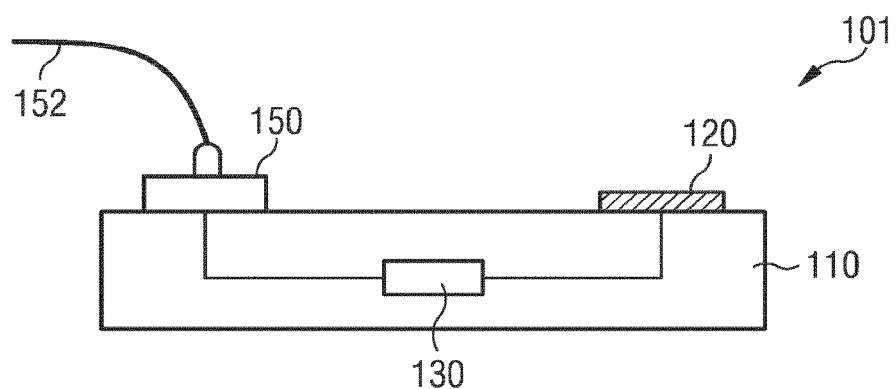
FIG. 2 is a schematic depiction of a lateral section of a light source according to one preferred embodiment of the invention.

An exemplary integration is shown in preferred embodiments 2 and 3. FIG. 2 shows an electroluminescent light source 101 comprising a substrate 110 made of silicon and at least one thin-film light-emitting diode 120 arranged on the substrate. As an alternative, the light-emitting diodes may be in the form of micro-wires or nano-wires, as described in relation to FIG. 1. The source furthermore comprises an electronic circuit 130 intended to perform a function that is necessary for controlling the diode(s) 120. The substrate 110 is made of silicon, thereby making it possible to integrate the circuit 130 directly into the substrate 110, for example by etching. Directly implanting an electronic circuit 130 makes it possible to dispense with external interconnection means between the circuit 130 and the diode 120. Electric current is supplied to the diode 120 and to the circuit 130 by a common connection at the surface of the substrate 110. In the example shown, bonding pads 150 are linked to the circuit 130, which is linked to the diode 120. The connection to a current source of the motor vehicle is achieved by bridging 152 via a metal wire ("wire bonding") or via a metal strip ("ribbon bonding"). The configuration according to the invention makes it possible to group together a plurality of functions on the substrate 110. For example, the electronic circuit 130 may perform one of the following functions, the implementation of which is within the scope of those skilled in the art:

storing bin information relating to the light-emitting diodes 120;

measuring the temperature of the light-emitting diodes 120;

controlling the supply of electric power to the light-emitting diodes 120;

the circuit making it possible to switch between at least two lighting functions 120, for example between a "high-beam" function and a "low-beam" function;

the circuit making it possible to choose a specific electrical connection of a plurality of groups of light-emitting diodes. The circuit may in particular switch between a series connection and a parallel connection of a plurality of groups of diodes of the light source, protecting the groups of rods and/or limiting the current flowing through these groups.

Other functionalities are able to be contemplated and implemented by those skilled in the art without otherwise departing from the scope of the present invention, the list given not being exhaustive.

Figure 3:
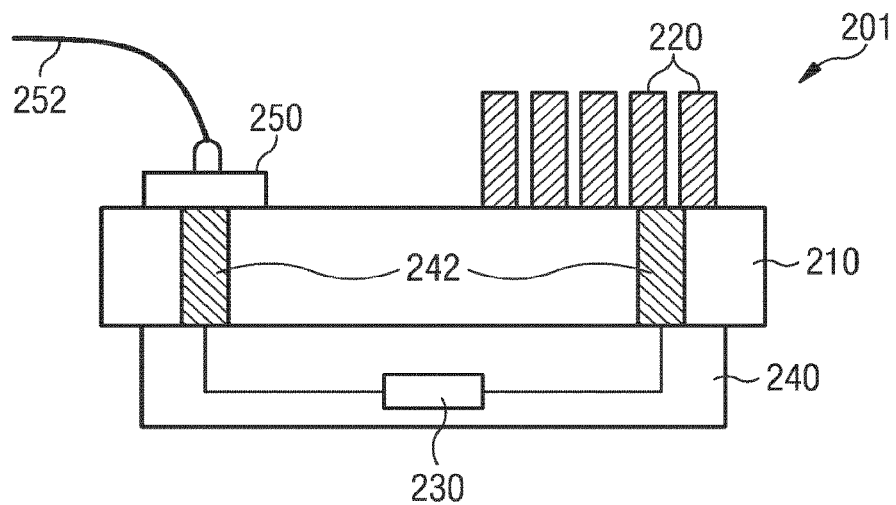
FIG. 3 is a schematic depiction of a lateral section of a light source according to one preferred embodiment of the invention.

The embodiment of FIG. 3 comprises an electroluminescent light source 201 comprising a first substrate 210 made of silicon and light-emitting rods 220 of submillimetric size projecting from the substrate. As an alternative, thin-film light-emitting diodes may be arranged on the substrate. The light source furthermore comprises a second substrate 240 made of silicon and that houses an electronic circuit 230 intended to perform a function that is necessary for controlling the diode(s) 220.

The second substrate 240 is attached to the first substrate 210. The two substrates are attached to one another, for example by way of a gold-tin solder. The second substrate 240 is attached to the first substrate 210 on that face of the latter that is opposite the face on which the diodes 220 are arranged. The component resulting from this assembly is of "multi chip package" type, the second substrate integrating an additional function, that is to say a function linked to the control of the light source, with respect to the primary function of the source, i.e. the emission of light rays.

Electric current is supplied to the diode 220 and to the circuit 230 by a common connection at the surface of the substrate 210. In the example shown, bonding pads 250 are linked to the circuit 230, which is linked to the diode 120. The connection to a current source of the motor vehicle is achieved by bridging 252 ("wire bonding"). The electrical connection between the substrates 210 and 230 is achieved for example by vias 242. TSV ("Through Silicon Via") technology makes it possible for example to produce holes by laser drilling of the substrates. The resulting holes are metallized, typically by an electrochemical deposition of copper.

The invention claimed is:

1. A semiconductor light source, comprising:
   a first substrate made of silicon;
   at least one light-emitting diode arranged on the first substrate;
   an electronic circuit to perform a function for controlling the at least one light-emitting diode; and
   a second substrate made of silicon and attached to the first substrate, the electronic circuit being entirely implanted inside the second substrate.

2. The semiconductor light source as claimed in claim 1, wherein the second substrate is attached to the first substrate on the face opposite the face on which the at least one light-emitting diode is arranged.

3. The semiconductor light source as claimed in claim 1, wherein the first substrate and the second substrate are attached to one another by solder.

4. The semiconductor light source as claimed in claim 2, wherein the first substrate and the second substrate are attached to one another by gold-tin solder.

5. The semiconductor light source as claimed in claim 1, wherein the first substrate and the second substrate comprise vias for the electrical interconnection of the two substrates.

6. The semiconductor light source as claimed in claim 1, further comprising a plurality of light-emitting diodes.

7. The semiconductor light source as claimed in claim 6, wherein the plurality of light-emitting diodes are distributed into a plurality of groups, the diodes of each group emitting a specific light.

8. The semiconductor light source as claimed in claim 7, wherein each of the groups emits light of a specific intensity and/or color.

9. The semiconductor light source as claimed in claim 1, wherein the at least one light-emitting diode is in the form of a light-emitting rod of submillimetric size projecting from the first substrate.

10. The semiconductor light source as claimed in claim 1, wherein the at least one light-emitting diode is in the form of a thin film.

11. The semiconductor light source as claimed in claim 1, wherein the first substrate comprises bonding pads intended to connect the first substrate electrically to a current source by bridging.

12. The semiconductor light source as claimed in claim 1, wherein the electronic circuit is configured to perform at least one of the following:
   storing bin information relating to the at least one light-emitting diode;
   measuring the temperature of the at least one light-emitting diode;
   controlling the supply of electric power to the at least one light-emitting diode;
   switching between at least two lighting functions;
   choosing a specific electrical connection of a plurality of groups of light-emitting diodes;
   protecting the groups of rods and/or limiting the current flowing through the groups of rods.

13. A lighting module comprising:
   the at least one light source as claimed in claim 1, emitting light rays; and
   an optical device receiving the light rays and producing a light beam.

* * * * *